(12) United States Patent
Gajda et al.

(10) Patent No.: US 6,780,714 B2
(45) Date of Patent: Aug. 24, 2004

(54) SEMICONDUCTOR DEVICES AND THEIR MANUFACTURE

(75) Inventors: Mark A. Gajda, Stockport (GB); Michael A. A. in 't Zandt, Veldhoven (NL); Erwin A. Hijzen, Blanden (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 4 days.

(21) Appl. No.: 10/227,672

(22) Filed: Aug. 26, 2002

(65) Prior Publication Data

US 2003/0042556 A1 Mar. 6, 2003

(30) Foreign Application Priority Data

Sep. 4, 2001 (GB) ............................................. 0121345
Nov. 29, 2001 (GB) ............................................. 0128525

(51) Int. Cl.[7] ........................ H01L 21/336; H01L 21/76
(52) U.S. Cl. ........................ 438/270; 438/296; 438/424
(58) Field of Search ................................ 438/270, 296, 438/424, 657, 294, 295, 318

(56) References Cited

U.S. PATENT DOCUMENTS

| 3,953,879 | A | * | 4/1976 | O'Connor-d'Arlach et al. . | 257/271 |
|---|---|---|---|---|---|
| 5,019,877 | A | | 5/1991 | Hosogi ........................ | 357/22 |
| 5,527,720 | A | | 6/1996 | Goodyear et al. ............. | 437/29 |
| 5,672,528 | A | | 9/1997 | Disney et al. ................. | 437/41 |
| 5,841,858 | A | | 11/1998 | Frierson ....................... | 257/328 |
| 6,087,234 | A | | 7/2000 | Wu .............................. | 438/299 |
| 6,146,970 | A | * | 11/2000 | Witek et al. ................. | 438/424 |
| 6,251,734 | B1 | * | 6/2001 | Grivna et al. ................ | 438/296 |
| 6,518,129 | B2 | * | 2/2003 | Hueting et al. ............. | 438/270 |
| 6,525,425 | B1 | * | 2/2003 | Woo et al. .................... | 438/654 |

FOREIGN PATENT DOCUMENTS

| EP | 1009035 A1 | 6/2000 | ........... H01L/29/78 |
|---|---|---|---|
| WO | WO9921215 | 4/1999 | ......... H01L/21/336 |

* cited by examiner

*Primary Examiner*—John F. Niebling
*Assistant Examiner*—Walter L. Lindsay, Jr.
(74) *Attorney, Agent, or Firm*—Aaron Waxler

(57) ABSTRACT

In a cellular power MOSFET or other semiconductor device, a wide connection across the perimeter of an active device area (120) is replaced with a plurality of narrower conducting fingers (111). The fingers (11) are used as follows in providing a doped edge region (15a) that is required below the connection (110). Dopant (150,151) is implanted at spaces (112) between and beside the fingers (111) and is diffused to form a single continuous region (15a) extending beneath the fingers (111) and at the spaces (112) therebetween. This doped edge region (15a) may be, for example, a deep guard ring in an edge termination of a power MOSFET, or an extension of its channel-accommodating region (15). A trench-gate network (11) of the MOSFET can be connected by the conducting fingers to a gate bond pad and/or field plate (114).

19 Claims, 11 Drawing Sheets

SEMICONDUCTOR DEVICES AND THEIR MANUFACTURE

This invention relates to semiconductor devices and their manufacture, and particularly in areas where an electrically conductive connection extends over an edge region of an active area of the device. The invention relates particularly, but not exclusively, to the formation of a gate connection at the perimeter of a MOSFET (i.e. an insulated-gate field-effect transistor) such as, for example, a trench-gate power MOSFET.

Trench-gate power MOSFETs are well-known semiconductor devices having active device cells comprising an insulated gate trench that accommodates the trench-gate and extends from a source region through a channel-accommodating region and into an underlying drain region of the MOSFET. The trench-gate is dielectrically coupled to the channel-accommodating region by an intermediate gate-dielectric layer (typically oxide) at sidewalls of the gate trench.

Particular examples of a trench-gate power MOSFET are disclosed in published European patent application EP-A-1 009 035, which is concerned with improving the breakdown characteristics of the device, particularly in device termination areas. Thus, measures are taken to relieve the electric field at the upper and bottom end edges (UE & BE respectively) of the gate trench, where a gate connection extends to a gate pad and/or field-plate beyond the active cellular area of the device. The whole contents of EP-A-1 009 035 are hereby incorporated herein as reference material.

At the perimeter area around the active area, the channel-accommodating region and the gate trench network terminate in an edge region of the first conductivity type. This termination enhances the breakdown voltage at the bottom end edge (BE) of the gate trench. The edge region may be an extension of the channel-accommodating region, or it may be a deeper and more highly doped region than the channel-accommodating region. In each case, the gate trench is provided after providing the edge region and the channel-accommodating region. The gate connection is then provided over this edge region.

EP-A-1 009 035 discloses various gate connection schemes for relieving and/or eliminating the electric field in insulating films at the upper end edge (UE) of the gate trench. In particular, the gate connection is kept away from this upper end edge (UE) of the gate trench. The present Applicants note that, in some of these embodiments (FIGS. 46, 57, 61 & 67 of EP-A-1 009 035), the resulting gate connection comprises electrically parallel conductive fingers as a consequence of the provision of these spaces around parallel trench-gate ends.

The present invention is based on a different approach, in respect of which the present FIG. 1 shows an experimental trench-gate MOS transistor structure, not previously published. The drawing is a simplified MOST schematic, e.g. its source region 13 and source electrode 23 are omitted. In this case, the insulated trench-gate 11,16 is formed before the so-called "P-body implant" that provides the p-type channel-accommodating region 15 for this n-channel device. This sequence is found advantageous in optimising the channel profile in a trench-gate MOSFET.

Thus, in order to optimise the channel profile, the formation of the gate dielectric 16 (typically by oxidation) is preferably done before the P-body implant. This gives a larger degree of freedom in the thermal budget used to form the channel-accommodating region 15 (P-body), resulting in a lower channel resistance. However, the P-body implant (and any deeper P implant) cannot be performed directly after forming the gate oxide 16, because this would result in implanting the dopant at the bottom of the gate trench 20, which is undesirable. Therefore, the implants are carried out after depositing and patterning the gate 11. Furthermore, performing the P-body implant (and any deeper P implant) after forming the trench-gate 11 is preferable in order to reduce outdiffusion of the P-dopant during sacrificial oxide and gate oxide growth in the trench 20.

However, this sequence of performing the implants after forming the insulated trench-gate 11,16 results in an absence of these implants at the edge of the MOSFET, as shown in FIG. 1. Thus, it prevents inclusion of the P-body (or deeper P-region) below a gate connection 110 to, for example, a gate bond pad 114 and/or field-plate 114 at the edge termination of the active device area 120. This absence of the P-body (or deeper P-region) can cause premature voltage breakdown and loss of ruggedness.

Thus, FIG. 1 shows the resulting end RE of the P-body 15 at the perimeter of the active area 120 of the trench-gate MOS transistor. It can be seen that this end RE does not extend as far as the outer trenches 12 at the device perimeter in FIG. 1. Consequently, a high electric field is experienced at the base of these perimeter trenches 12 having no P-body 15. This leads to premature breakdown, as shown by the star BD in FIG. 1.

It is an object of the present invention to address the above-mentioned disadvantages in semiconductor devices generally, as well as in MOSFETs. Furthermore, it is an object of an important embodiment of the present invention to provide a trench-gate MOSFET having better breakdown voltage characteristics.

According to a first aspect of the present invention there is provided a method of manufacturing a semiconductor device comprising an electrically conductive connection that extends over an edge region of an active area of the device, wherein the connection comprises electrically-parallel conductive fingers, and wherein the method includes the steps of:

(a) forming the fingers over an area where the edge region is to be provided;

(b) subsequently implanting dopant of a first conductivity type for the edge region via spaces between said fingers; and (c) diffusing the said dopant beneath the fingers so as to form the edge region as an at least substantially continuous region of the first conductivity type that extends beneath the fingers and beneath the spaces between the fingers.

This use of connection fingers and their associated spaces advantageously allows the edge region to be provided after formation of the connection (and hence after trench-gate formation in trench-gate device manufacture), by diffusion of its dopant beneath the fingers.

The present invention can be used advantageously to provide an edge region (such as a termination extension of the channel-accommodating region and/or a guard-ring and/or ruggedness region) below a gate connection of a MOSFET device. It can be used very advantageously in a trench-gate cellular power MOSFET. Specific trench-gate features are set out in claim 3 to 7, 13 and 14. However, the present invention may be used advantageously to provide connections over edge regions in other types of semiconductor device, for example in a bipolar transistor or even in an integrated circuit.

Wide ranges of values for the particular parameters of the fingers and of the dopant diffusion are possible, depending on the particular device area where the invention is used, on device-feature dimensions, and on the specific manufacturing technology used.

The dopant diffusion step (c) maybe carried out in one or more stages, after the doping step (b) and/or during the doping step (b). The diffusion may take place over a time period of between, for example, 5 minutes and 200 minutes, and typically between about 10 minutes and 100 minutes. The diffusion may be performed at temperatures in excess of approximately 950° C., and preferably above approximately 1,050° C. Typically, the dopant for a P-type region may be boron.

The fingers (defined in step (a)) may have a width in the range of, for example, 0.1 to 20 $\mu$m, and typically in the range approximately 0.6 to 2 $\mu$m. The fingers may be substantially parallel to one another, to form a connection of compact width. The gaps (spaces) between adjacent fingers may be between 1 and 50 $\mu$m, for example, 2 to 17 $\mu$m. The width of these spaces is preferably approximately 3 times a finger width or more, for example approximately 4 to 15 $\mu$m. The fingers may have a length to width ratio in the range of 2:1 to 40:1, and typically in the range 15:1 to 20:1.

Typically, the electrically conductive fingers may be formed of conductively-doped polysilicon. This conductive doping may be effected in a special step for the polysilicon, and/or it may be effected in a doping step used for a device region. The conductivity of polysilicon fingers can be enhanced by converting at least a part of the polysilicon to a metal silicide. This siliciding can be effected before or after the doping step (b) for the edge region. However, other materials are possible for the fingers. Thus, for example, the fingers may be made of refractory metal, and/or of a combination of materials.

In trench-gate device manufacture, the finger-definition step (a) is preferably performed after formation of the trench-gate network and preferably after growth of a gate oxide region in the trench-gate network.

In one form, the finger-definition step (a) preferably includes:

(a.i) depositing the material for forming the fingers;

(a.ii) defining a pattern for the electrically conductive fingers with a mask; and (a.iii) etching the deposited material to leave the fingers defined by the mask.

This finger definition may be done in the same process steps as used to etch-back (planarise) the trench-gate in the gate trench. Thus, step (a.iii) may comprise etch defining the electrically conductive fingers while planarising the trench-gate. If there is a risk that this etching step (a.iii) may damage exposed areas of the gate dielectric, then step (a) also preferably includes:

(a.iv) re-growing damaged areas of the gate dielectric after the planarisation step (a.iii).

The pattern defined by the mask in step (a.ii) may include not only the fingers but also other parts of the device to be made of polysilicon.

The edge region may be deeper and/or more highly doped than the channel-accommodating region. Preferably, in that case, the doping step (b) is achieved with a ruggedness implant. Thus, step (b) may include:

(b.i) defining with a mask in the active device area a pattern for a ruggedness implant;

(b.ii) performing the ruggedness implant to form a ruggedness region at windows of the mask and to form a guard-ring edge-region around the active device area; and (b.iii) thereafter removing the mask.

The channel implant (for providing the channel-accommodating region) may be a maskless implant.

However, the channel implant may be used to provide the edge region at an edge of the trench-gate network (preferably around the entire perimeter of the trench-gate network) where no active device channel is formed.

The fingers may be free-standing over the edge region and may extend between end connections such as a gate pad or field-plate and a MOSFET trench-gate network. The free-standing fingers may be produced by etching material away from beneath the fingers.

The capacitance between gate and source of a MOSFET can be advantageously reduced by making the fingers free-standing.

The free-standing fingers may comprise a second layer of conductive material contacting a first layer that provides the gate network of a trench-gate MOSFET. The fingers may be otherwise un-connected to the trench-gate network. The second layer may be intermittent.

In an alternative form, the finger-definition step (a) preferably includes forming the electrically conductive fingers as sidewall spacers, by etching back contour-deposited material.

In this alternative form for trench-gate MOSFET manufacture, step (a) may include:

(a.i) depositing a sacrificial layer (e.g. an oxide) and patterning said sacrificial layer with a first mask to define the shape of the fingers;

(a.ii) depositing material for the fingers over the patterned sacrificial layer;

(a.iii) then etching back said finger material to form the fingers as sidewall spacers in the patterned sacrificial layer; and (a.iv) etching away the sacrificial layer to leave the fingers.

Loop-shaped fingers may be etch-formed in step (a.iii).

According to a second aspect of the present invention there is provided a semiconductor device comprising an electrically conductive connection that extends over an edge region of an active area of the device, wherein the connection comprises electrically parallel conductive fingers, and wherein the edge region is an at least substantially continuous region of the first conductivity type that extends beneath the fingers and beneath spaces between the fingers, and the edge region has a diffused dopant profile beneath the fingers that is of dopant diffused from beneath spaces between the fingers.

Other advantageous features in accordance with the first and/or second aspect of the present invention are set out in the appended Claims. All of the features described herein can be combined with any other feature in any of the above aspects, in any combination.

Specific embodiments of the present invention will now be described, by way of example, and with reference to the accompanying drawings, in which:

FIGS. 9 to 11 are schematic sectional views of the device part of FIG. 7 at subsequent stages in its manufacture by the first embodiment of the invention, of which FIG. 9A is taken on a line that is along a conductive fingers, whereas FIGS. 9B, 10 & 11 are taken on a line that is along a space between conductive fingers;

Figure 1:
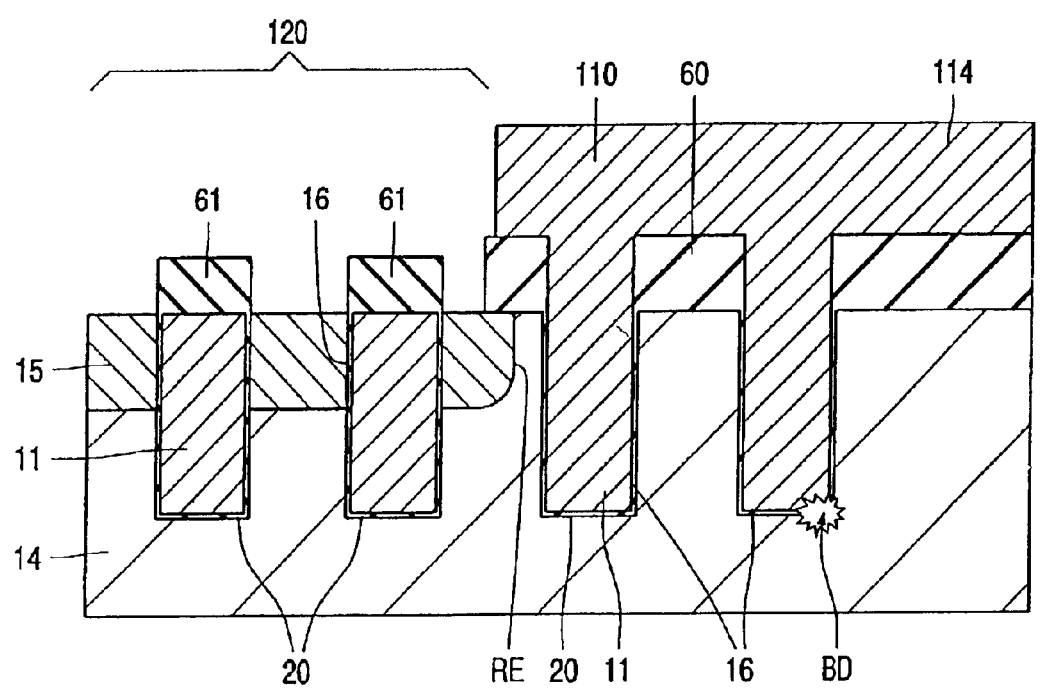
FIG. 1 is a schematic sectional view of part of an unconventional (and unpublished) self-aligned trench-gate MOSFET, without an edge region under its gate connection.
Figure 2:
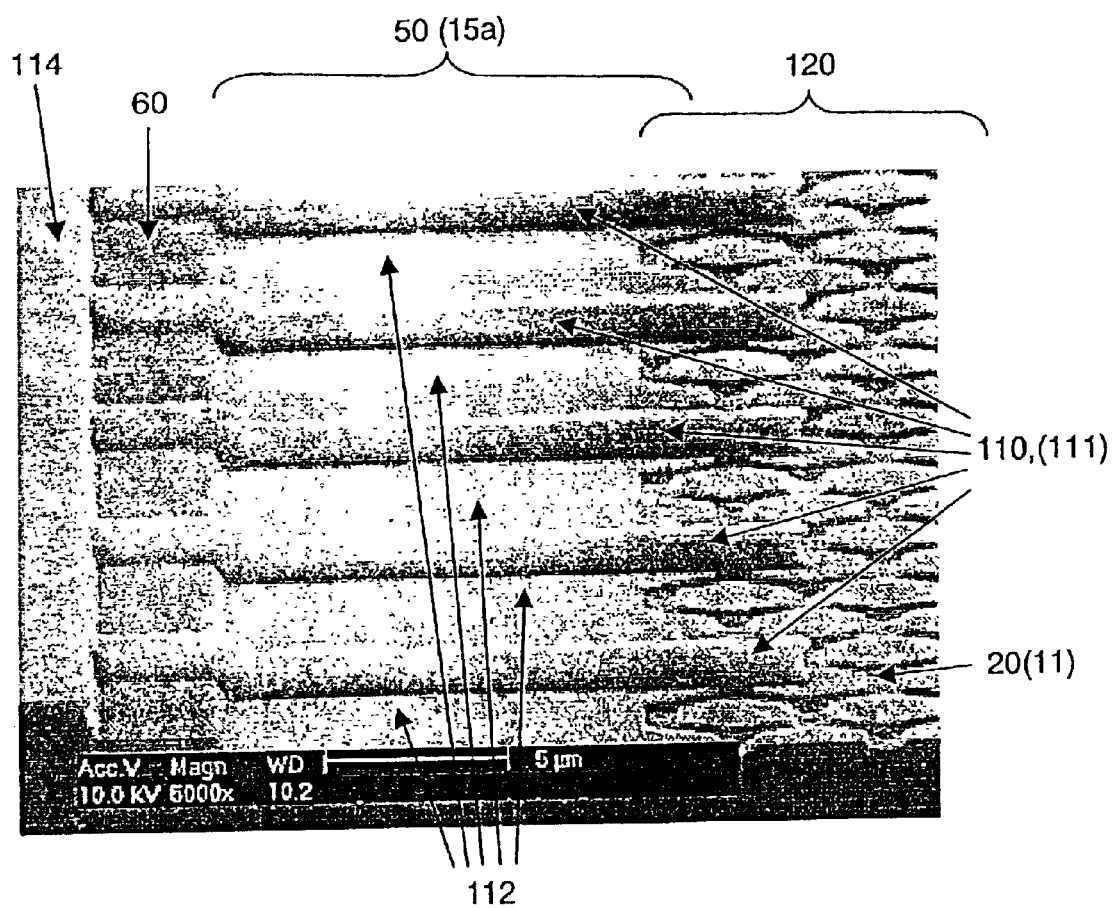
FIG. 2 is a SEM (scanning electron microscope) photograph of a perspective view of a specific example of one embodiment of the invention, wherein an edge region is formed beneath a gate connection comprising conductive fingers.
Figure 12:
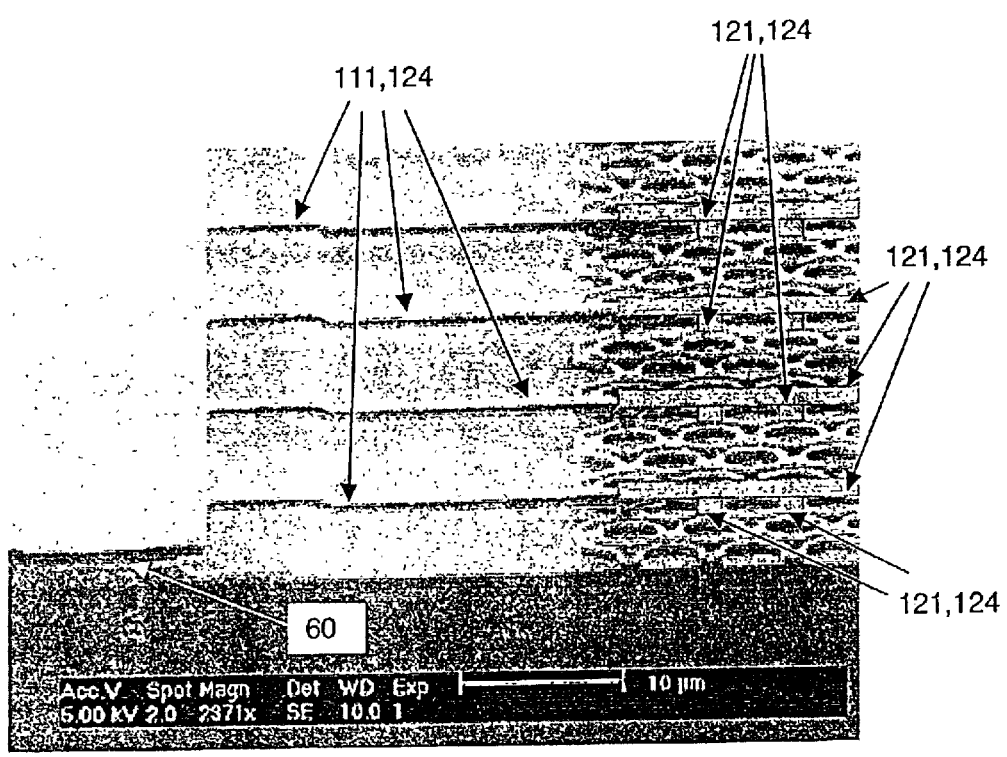
FIG. 12 is a modification of the SEM (scanning electron microscope) photograph of FIG. 2 to illustrate in perspective view an extension of the conductive fingers as free-standing fingers over the active device area in a specific example of another embodiment of the invention.
Figure 13:
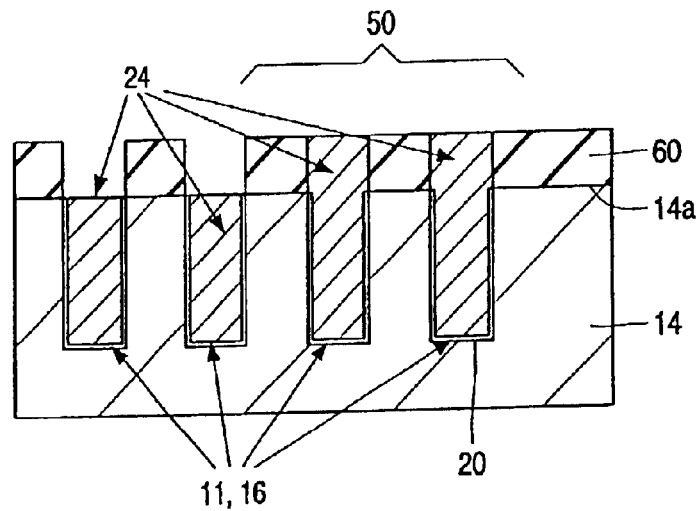
FIGS. 13 to 16 are schematic sectional views of a device part at a sequence of stages in manufacture for a second embodiment of the invention, wherein the conductive fingers are formed as sidewall spacers.

It should be noted that, except for the SEM photographs of FIGS. 2 & 12, all the drawings are diagrammatic. Thus, relative dimensions and proportions of parts of these drawings have been shown exaggerated or reduced in size, for the sake of clarity and convenience in the Figures. The same reference signs are generally used to refer to corresponding or similar features in modified and different embodiments, as well as in FIG. 1.

General Overview of Device & Process Embodiments

Reference is first made in general terms to semiconductor device features illustrated in FIG. 2. In these general terms, the present invention permits the manufacture of a semiconductor device comprising an electrically conductive connection 110 that extends over an edge region 15a of a device area 120. This connection 110 comprises electrically-parallel conductive fingers 111. The edge region 15a is an at least substantially continuous region of a first conductivity type, that extends beneath the fingers 111 and beneath spaces 112 beside and between the fingers 111. Unlike the edge regions disclosed in the prior art (e.g. in EP-A-1 009 035), the edge region 15a in a device in accordance with the invention has a diffused dopant profile beneath the fingers 111. This dopant profile beneath the fingers 111 is of dopant diffused from beneath the spaces 112 beside and between the fingers 111.

FIG. 2 illustrates a first type of manufacturing method, in which the pattern of the fingers 111 is defined by a photolithographic mask. An example of this first type of process embodiment will be described with reference to FIGS. 3 to 11. A second type of process embodiment is illustrated in FIGS. 13 to 20, in which the pattern of the fingers is defined as side-wall spacers. Both types of process embodiment in accordance with the present invention involve a manufacturing method that, viewed in general terms, includes the steps of:

(a) forming the fingers 111 over an area 50 where the edge region 15a is to be provided (see FIGS. 2, 8, 9A, 9B, 18 and 19);

(b) subsequently implanting dopant of a first conductivity type for the edge region 15a via spaces 112 between said fingers 111 (see FIGS. 10, and 20); and (c) diffusing the said dopant beneath the fingers 111 so as to form the edge region 15a as an at least substantially continuous region of the first conductivity type that extends beneath the fingers 111 and beneath the spaces 112 between the fingers (see FIGS. 3A, 3B, 11 and 20).

The specific device embodiment of FIG. 2 is a power MOSFET having a trench-gate network 11 in an active cellular area 120 of the device. The connection 110 (typically comprising polysilicon) connects this trench-gate network to a field plate 114 or gate pad 114 on a field oxide 60 around the MOSFET perimeter. The polysilicon fingers 111 of this connection allow a doped region 15a to be formed in the device substrate 10 below the connection 110 by implanting the dopant at the gaps between the fingers 10 and then diffusing the dopant to form a single continuous region under the fingers 10.

All of the specific device embodiments (FIGS. 2 to 20) are trench-gate power MOSFETs, in which the connection 110 is a gate connection over an edge region 15a at the MOSFET perimeter. The basic MOSFET structure of each of these device embodiments comprises, in known manner, a large number of active device cells in a cellular area 120 of a semiconductor body 10, typically of silicon. These cells are connected in parallel between source & drain electrodes 23 & 24 respectively at front & back major faces of the body 10 (see FIG. 3 example).

Each active device cell has a channel-accommodating region 15 of a first conductivity type (p-type in these specific examples) between a surface-adjacent source region 13 and an underlying drain region 14 that are of a second conductivity type (i.e. n-type in these specific examples). Typically the region 14 is a low-doped (n) drain drift region on a higher doped (n+) drain electrode region 14d. An insulated gate trench 20 accommodating the trench-gate 11 extends from the source region 13 through the channel-accommodating region 15 and into the underlying drain region 14. The trench-gate 11 is dielectrically coupled to the region 15 by an intermediate gate-dielectric layer 16 (typically oxide) at sidewalls of the gate trench 20. Thereby, a conduction channel 12 is induced in the region 15 between the source & drain regions 13 & 14, in an on-state of the MOSFET (see FIG. 3 example).

Figure 8:
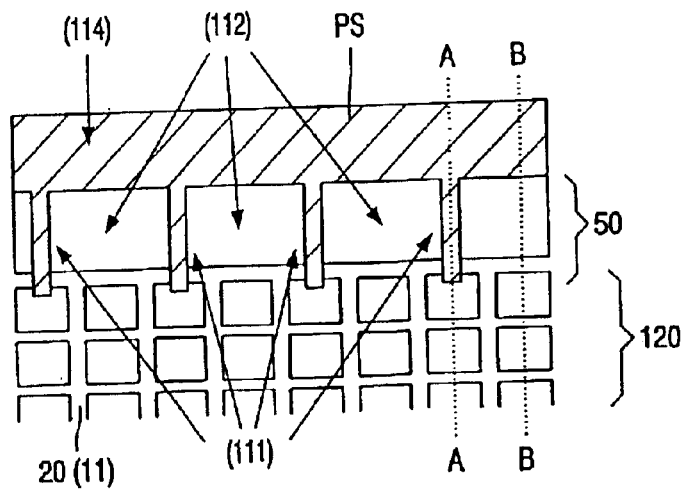
FIG. 8 is a schematic plan view of a next stage in its manufacture, using a mask to define the pattern of conductive fingers in this first embodiment.

The active device cells of these trench-gate MOSFETs may have any known layout geometry, for example close-packed hexagonal, or square matrix, or elongate stripes. By way of example, FIGS. 2, 12, 17 and 19 illustrate a hexagonal trench network, whereas FIG. 8 illustrates a square matrix. Around the perimeter of its active cellular area 120, each MOSFET embodiment has an annular termination structure that comprises the field insulator 60 and a guard ring in the form of edge region 15a. The gate connection 110

(comprising the fingers 111) extends over this guard-ring region 15a, between the trench-gate network 11 of the active cellular area 120 and a gate bond-pad and/or field-plate 114 in the device termination.

The present invention is used in each of the embodiments of FIGS. 2 to 20, so as to allow the provision of guard-ring region 15a in steps (b) and (c) after the finger structure of the gate connection 110 is formed. Different dopant implants may be used for providing different forms of the region 15a. Two such different forms, by way of example, will be described in the specific embodiments of FIGS. 3 to 11 and of FIGS. 13 to 20.

Embodiment of FIGS. 3 to 11

Figure 3A:
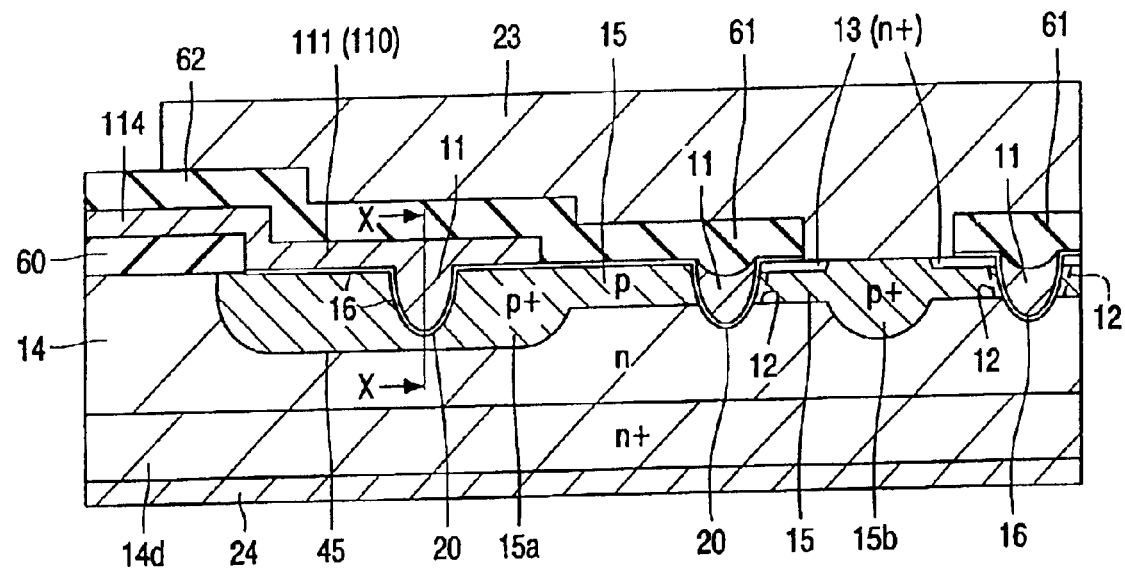
FIG. 3A is a schematic sectional view of a part of a trench-gate MOSFET embodiment of the invention, taken on a line that is along a conductive finger of the gate connection.
Figure 3B:
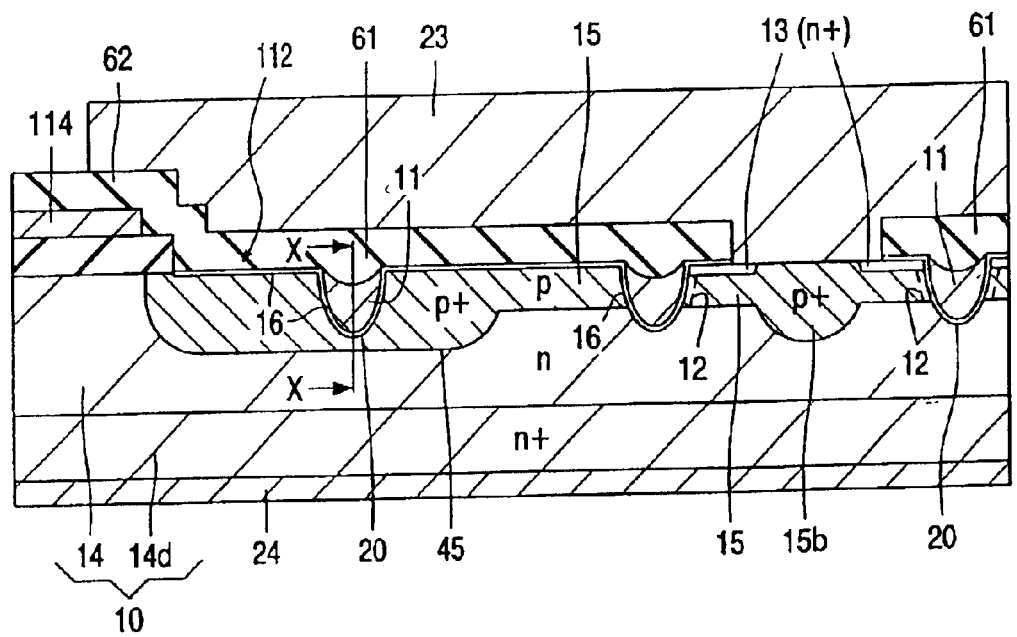
FIG. 3B is a schematic sectional view of the part of a trench-gate MOSFET embodiment of FIG. 3A, but taken on a line that is along a space between conductive fingers of the gate connection.

In this power MOSFET embodiment, the edge region 15a is formed with a so-called AP implant that is deeper and a higher dose than the P-body (channel) implant that forms the channel-accommodating region 15. This AP implant, typically with a heavy dose (~$2\times10^{15}$ cm$^{-2}$) of boron, is used to provide a P+ ruggedness region 15b in at least some cells in the active device area 120, as illustrated in FIGS. 3A & 3B. Ruggedness is the ability of the MOSFET device to dissipate energy while operating in the avalanche condition.

Thus, an early separate guard-ring implant (DP) that forms the prior-art interface between the active area 120 and the device edge termination (e.g. as in EP-A-1 009 035) can be avoided. As a result, an existing 3-photomask process flow DP/OD/AP (guard-ring implant; field oxide etch; and ruggedness implant) is replaced by one involving only OD and AP masks (a 2-photomask process flow: field oxide etch; guard-ring & ruggedness implant).

The process flow of this embodiment will now be described in relation to FIGS. 6 to 11.

Figure 6:
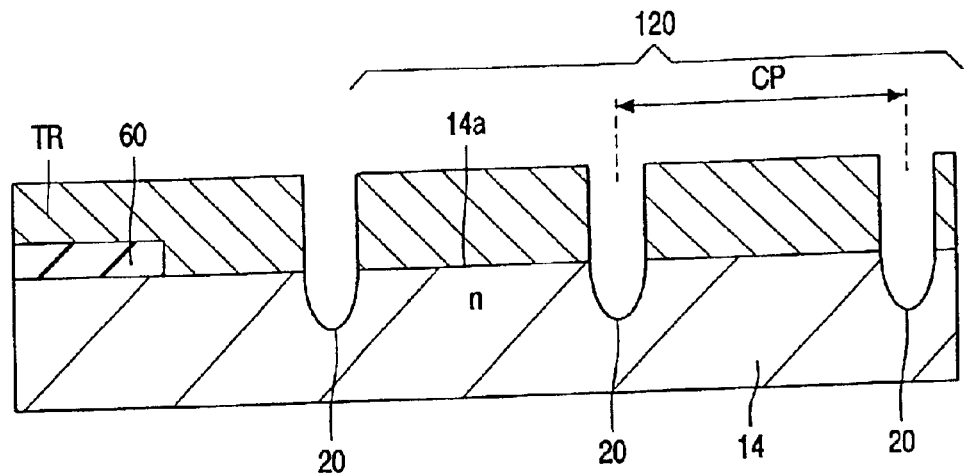
FIGS. 6 & 7 are schematic sectional views of the device part of FIG. 3A (and also of FIG. 3B) at two consecutive stages in its manufacture by a first embodiment of the invention.

Firstly, a thick oxide layer is grown (e.g. to a thickness of approximately 0.8 to 0.9 micrometre) on the silicon wafer surface 14a and is patterned by etching in an OD mask stage to provide the field oxide 16 around the active device area 120. Thereafter a TR mask is provided to define the network of interconnected trenches 20, which are then etched into the epitaxial region 14. A cross-section of the resulting structure is shown in FIG. 6, with the TR mask still present. The cell pitch designated as CP is determined by the mask TR in the active area 120. The trench network as defined by this mask TR also includes a peripheral trench (see plan view of FIG. 8) around the perimeter of the area 120, where the region 15a will be formed.

After removing the TR mask, the process is continued by growing the gate oxide layer 16. This layer 16 is grown by thermal oxidation of the exposed silicon surface in the device area 120, including the trench network 20. A layer of polysilicon 24 is then deposited for providing the gate 11, gate bus-bars and connections (such as 110), and the gate pad and field-plate 114. In this specific embodiment, by way of example, each of the device parts 11, 110 and 114 is formed from the polysilicon layer 24 deposited at this stage. The conductivity of the polysilicon 24 is determined by doping and annealing. In this specific embodiment, the gate and its connections are kept as conductively-doped polysilicon. However, the polysilicon may also be silicided or refractory metal may be used in order to reduce electrical resistance.

The next stage is the PS mask step illustrated in FIG. 8. In this stage, a photoresist mask PS is provided over the areas of the polysilicon layer 24 which are kept to form the gate bus-bars and connections (such as 110), and the gate pad and field-plate 114. The layer 24 is then etched in the unmasked areas. This etch step defines inter alia the polysilicon finger pattern of connection 110, i.e. its fingers 111 and spaces 112. This etch step also etches back the layer 24 in the mostly unmasked area 120 so as to leave the polysilicon planarised in the trench network 20 to form the trench-gate 11. The gate oxide at the body surface (where not covered by the polysilicon fingers 111) is exposed during this etch step, and any etch-damaged areas are repaired by re-growing.

Figure 9A:
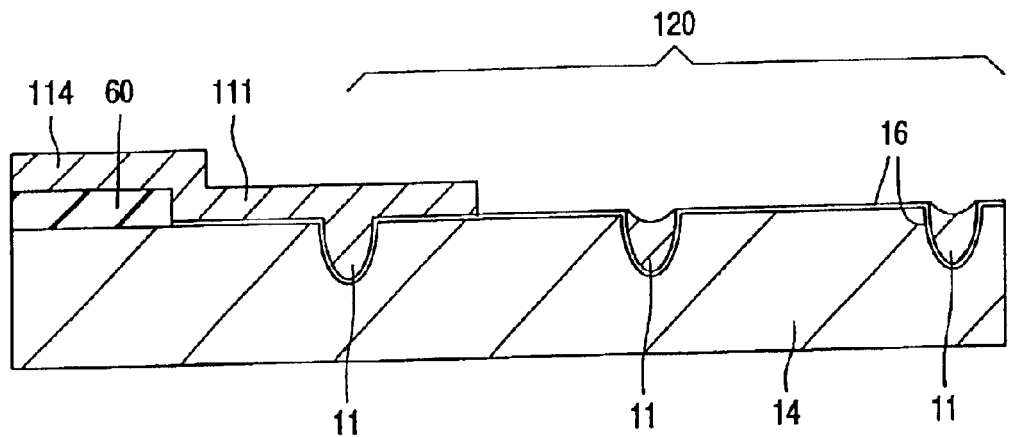
Figure 9B:
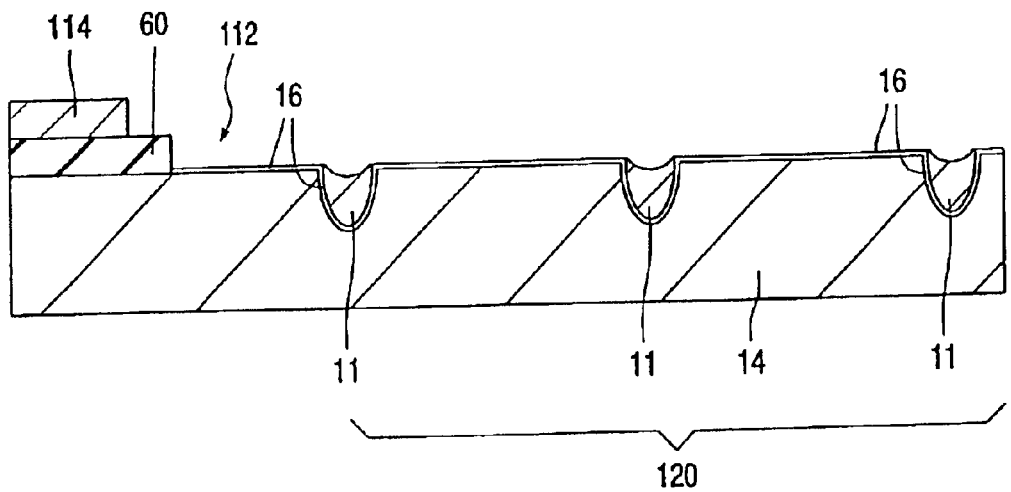

FIGS. 9A and 9B show cross-sections along the lines AA and BB respectively of FIG. 8, after removal of the PS mask. Both Figures show the planarised polysilicon gate 11 in the active device trenches 20. FIG. 9A shows a gate polysilicon finger 111 (as defined by the PS etching step) extending from the polysilicon gate 11 in the peripheral trench. As can be seen from FIG. 9B, the polysilicon in the section of the peripheral trench 20 in between the polyfingers 111 is planarised. The scanning electron micrograph of FIG. 2 is taken at this stage in the process, i.e. it shows the polysilicon pattern after this PS etch and planarisation, but with a hexagonal cell trench network in this particular example.

FIGS. 2, 9A & 9B illustrate the simplest arrangement, wherein the polysilicon fingers 111 connect with the trench-gate network 11 near the edge of the active area, i.e. via the peripheral trench 20 inside of the area 50 where the guard-ring region 15a is to be provided. The fingers 111 can extend on the dielectric layer 16 over the area 50 where the edge region 15a is to be formed. Typically, the polysilicon fingers 111 may have a width in the range of 0.6 μm to 2 μm. The fingers 111 are made deliberately narrow to allow the implanted AP dopant 150 to diffuse under the fingers 111.

Figure 10:
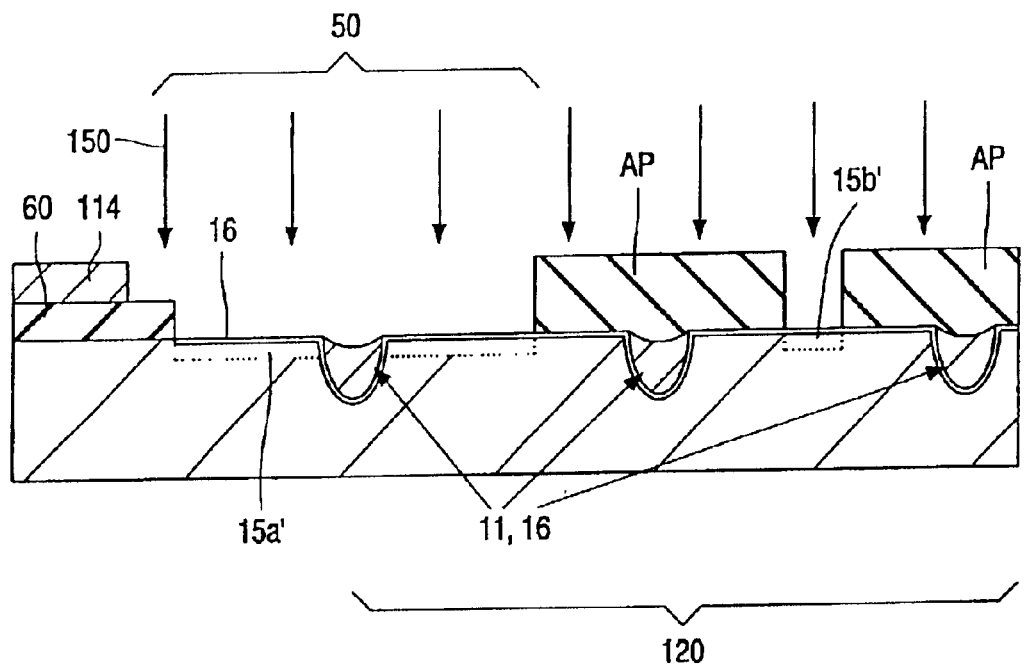

The next process stage is the masked AP (ruggedness) implant with dopant 150 (a high dose of boron ions in this example), as illustrated in FIG. 10. The AP mask, typically of photoresist, defines the implantation of dopant 150 for the P+ ruggedness regions 15b in the active device area 120 and defines the implant area 50 for the edge guard-ring region 15a. The inner perimeter of the guard-ring region 15a is defined by the AP mask, whereas the outer perimeter of this region 15a is defined by the inner edge of the field oxide 60, as shown schematically in FIG. 10.

Figure 4:
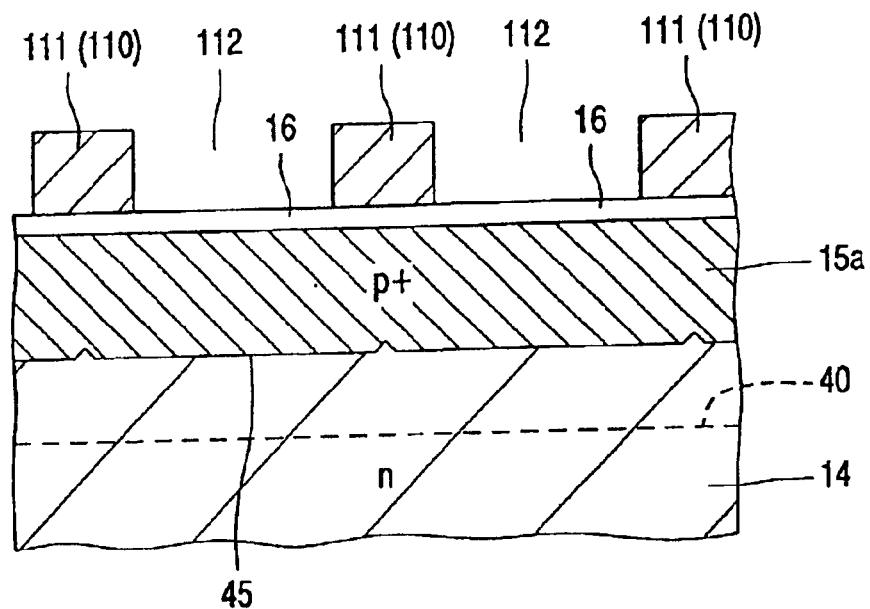
FIG. 4 is a schematic sectional view on the line X—X of FIGS. 3A and 3B, illustrating one example of a continuous edge region beneath the conductive fingers.
Figure 5:
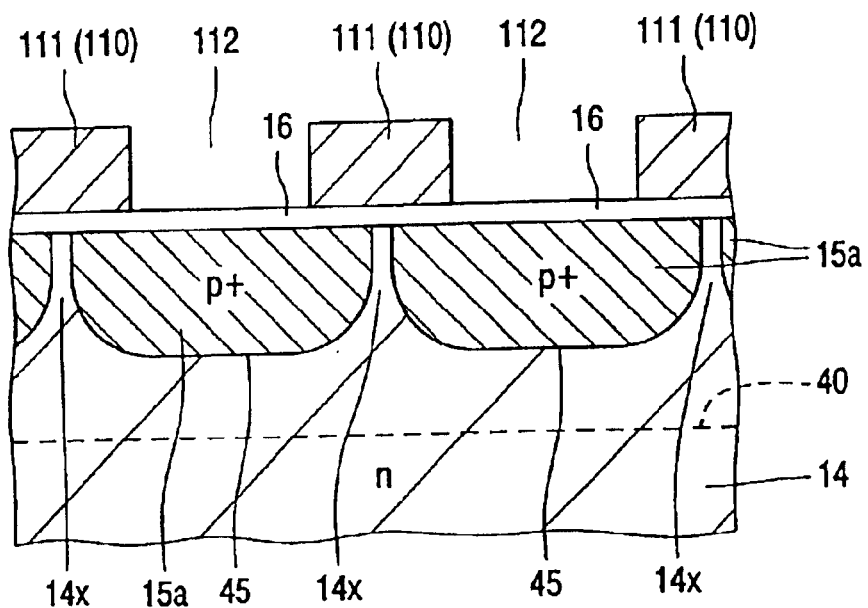
FIG. 5 is a schematic sectional view on the line X—X of FIGS. 3A and 3B, illustrating one example of a substantially continuous edge region beneath the conductive fingers.

The fingers 111, because of their thickness, also mask implantation of the AP dopant 150 directly beneath fingers (except in so far as the dopant ions 150 are scattered in the semiconductor crystal lattice). However, the fingers 111 are made sufficiently narrow (for example between 1 and 2 μm) that the AP implanted dopant 150 can diffuse thereunder to form an at least substantially continuous region 15a in accordance with the present invention. The diffusion is normally a high temperature step, running between approximately 10 and 100 minutes at temperatures exceeding 1,050° C. FIG. 4 illustrates a continuous region 15a in which the dopant 150 implanted at the adjacent spaces 112 has merged beneath the fingers 111. FIG. 5 illustrates a substantially continuous region 15a having very small gaps 14x between the adjacent diffused parts of region 15a. This very small gap (smaller than the depth of the region 15a) has no substantial effect on the guard-ring operation of region 15a. Thus, the spread of the depletion layer 40 from the p-n junction 45 between the drain region 14 and the substantially continuous region 15a is unaffected by the presence of the gaps 14x.

Because the AP implant and its diffusion is performed after growth of the gate oxide 16, the implanted dopant 150 can be diffused independent of this oxide growth. Indeed, the AP implant and its diffusion is even carried out after depositing and etching the polysilicon material for the gate 11 and its connection 110. Thus, the present invention allows the ruggedness AP implant and its diffusion to be used to provide the guard-ring region 15a independent of the provision of the insulated trench-gate 11 and the gate connection 110.

Figure 11:
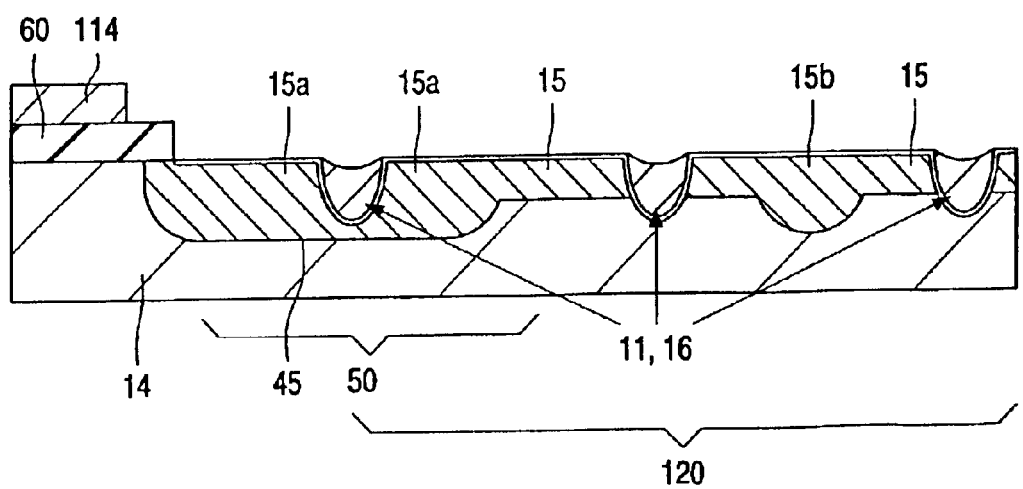

In more detail, as shown in FIGS. 10 and 11, the AP process sequence runs as follows. The photolith resist mask AP is applied. The AP implant 150 is then performed, and the resist mask AP is then stripped away. At this stage there is an option to anneal the implanted AP dopant 150 and diffuse it before the channel implant is performed. This allows for separate optimisation of ruggedness and channel implant thermal budgets.

After the AP implant of FIG. 10, an unmasked channel (P-body) implant is then performed to provide the channel-accommodating region 15 in the device cells, as illustrated in the left half of FIG. 11. The anneal of this P-body implant (and of course further diffusion of the AP implanted dopant 150) now follows and runs for approximately 10 to 100 minutes.

The remainder of the process flow can be conventional. Thus, the further process steps may comprise: a masked source implant to form source regions 13; deposition and etch definition of an oxide layer 61 & 62 to form source contact windows; metal deposition and its etch definition to form, inter alia, the source electrode 23, metal evaporation on the back of the wafer to form the drain electrode 24, and division of the wafer into individual MOSFET bodies. The deposited oxide forms an insulating cap 61 on the trench-gates 11 and an inter-level insulator 62 between the overlying source electrode 23 and the underlying connection 110 and field plate 114. However, more complex process flows based on self-aligned technologies can also benefit from incorporating the finger connection 110 and laterally-diffused region 15a into the their process sequence. One example of a self-aligned technology embodiment is described below with reference to FIGS. 13 & 20.

Embodiment of FIG. 12

FIG. 12 illustrates variants to the above embodiment.

Figure 7:
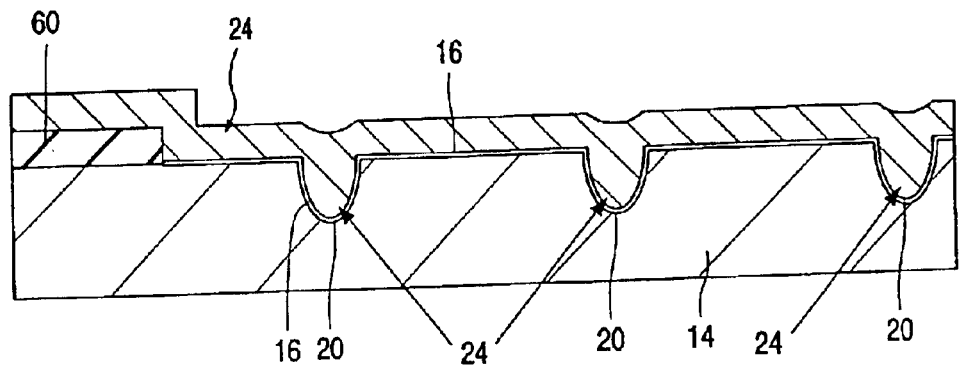

In the above embodiment, each of the device parts 11, 110 and 114 is formed from the same polysilicon layer 24 as illustrated in FIG. 7. In the embodiment of FIG. 12, the trench-gate 11 is formed by depositing and planarising a first polysilicon layer 24 without a mask, and thereafter the higher-level parts 110 and 114 can be formed by depositing and etching (with a mask) a second polysilicon layer 124.

In the FIG. 7 embodiment, the polysilicon layer 24 adjoins the thin (gate) oxide layer 16 both in the trench network 20 and on the wafer surface 14a outside the trench network 20. The variant embodiment of FIG. 12 permits the formation of free standing polysilicon fingers 111. Thus, for the FIG. 12 embodiment, a sacrificial layer (that is preferably thicker than the thin layer 16) is provided over the area 50. The fingers 111 can then be formed by depositing a polysilicon layer 124 on this sacrificial layer, and then masking and etching the polysilicon, as in the previous embodiment. Then, either before or after the AP implant, the sacrificial layer is etched away from beneath the fingers 111 to form an air gap beneath the fingers 111. This air-gap (as well as the spaces 112 in the finger structure 111) permits capacitance reduction between the connection 110 and the underlying edge region 15a. This can serve to reduce Cgs capacitance in a MOSFET, wherein the connection 110 is a gate connection, and wherein the source electrode contacts both the source region 13 and the channel-accommodating region 15. Thus, the air-gap can improve switching performance of the device.

Furthermore, as sketched schematically in FIG. 12, the free-standing fingers 111 formed from the second polysilicon layer 124 may be extended as free-standing gate bus-bars 121 across the active cellular area 120. These gate bus-bars can contact intermittently the trench-gate network 11, as indicated in FIG. 12.

Embodiment of FIGS. 13 to 20

Figure 20:
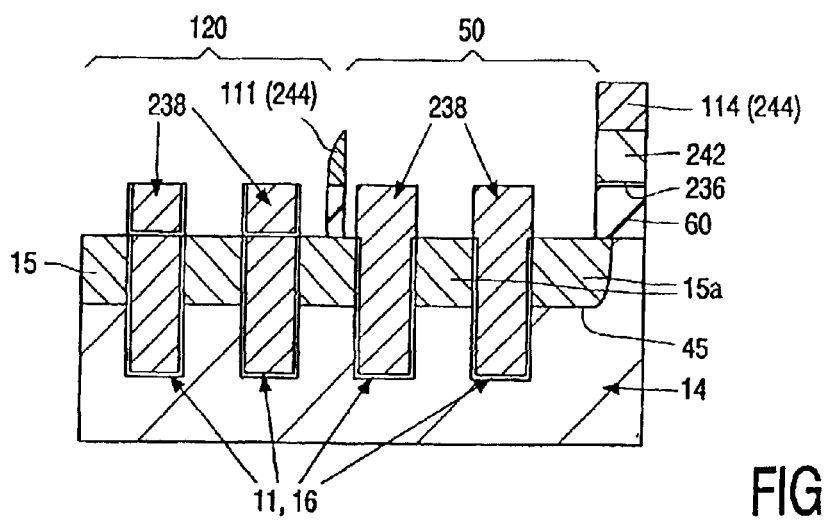
FIG. 20 is a schematic sectional view of a further stage in the manufacture of the second embodiment.

FIG. 20 illustrates a trench-gate MOSFET embodiment in which the edge region 15a (under the gate connection 110) is provided as an extension of the channel-accommodating region 15 beyond the cellular active area 120. Thus, the edge region 15a in this embodiment is provided in the same process steps as the channel-accommodating region (P-body) 15, i.e. with the same depth and dopant dose. This P-body dopant at the gate-connection area 50 is diffused under the fingers 111 to form the at least substantially continuous region 15a. The region 15a is not an active channel area, because source regions 13 subsequently provided in region 15 are not provided in the region 15a.

This embodiment uses a sidewall spacer technology to provide the connection 110 with even narrower polysilicon fingers 111 than the above embodiments. The use of even narrower polysilicon fingers 111 facilitates the dopant diffusion under the fingers and is also compatible with the smaller device features that can be obtained using a self-aligned trench-gate technology. The use of a self-aligned trench-gate technology permits the source region 13 and the contact window for the source electrode 23 to be self-aligned with respect to a narrow gate trench 20. Various self-aligned technologies may be used, for example that described in pending UK (GB) patent application 0101695.5 (our reference PHNL010060) having a UK priority date of 23rd Jan. 2001, the whole contents of which is hereby incorporated herein as reference material.

The novel process sequence in accordance with the present invention will now be described with reference to FIG. 13 to 20.

After etching the trench-gate network 20 and gate oxidation, the polysilicon 24 is deposited and etched back to the level of a silicon oxide layer 60. Then, with a mask over the perimeter area, the polysilicon 24 is etched back further to the level of the silicon wafer surface 14a in the active device area 120. As a result, it is only at the perimeter of the device (i.e. edge area 50 shown in FIG. 13) that the trench windows in the oxide layer 60 are still filled with polysilicon 24.

Figure 14:
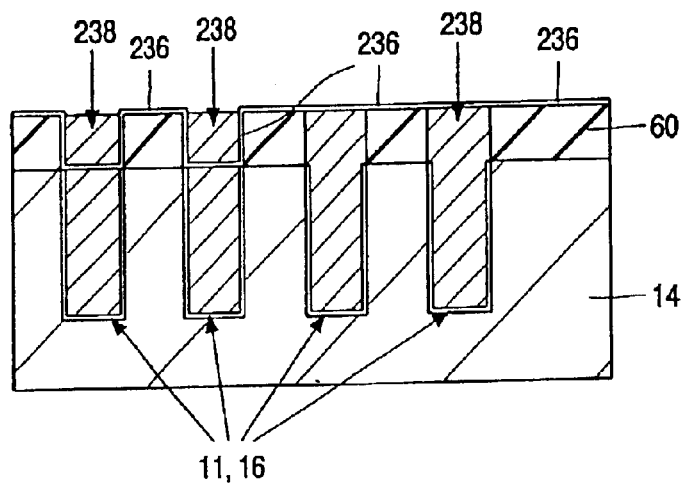

Thereafter, a relatively thin nitride layer 236 is deposited, followed by a second polysilicon deposition 238. This polysilicon layer 238 is then etched back anisotropically down to the nitride surface, as shown in FIG. 14. The nitride-polysilicon structure 236,238 is used to cap the trench-gates 11, instead of the oxide layer 61 of the previous embodiment.

Figure 16:
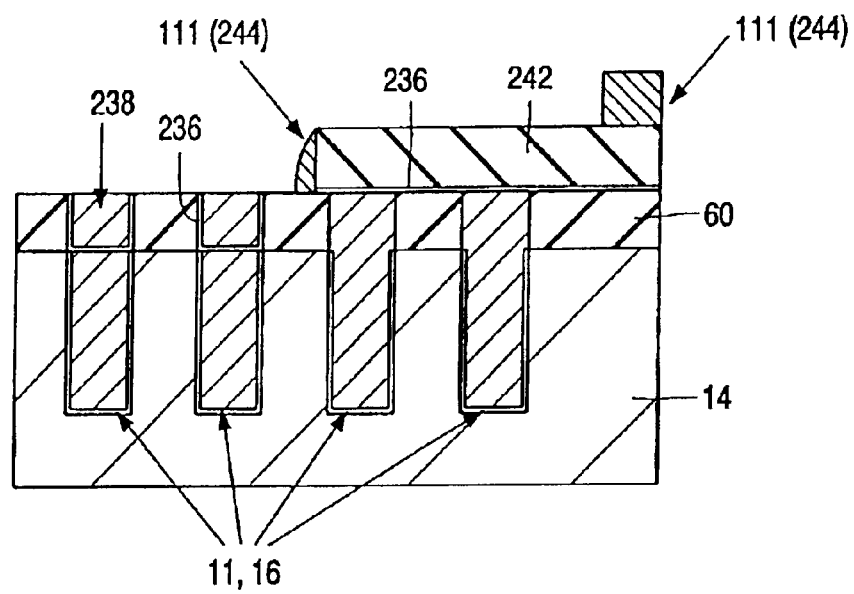
Figure 17:
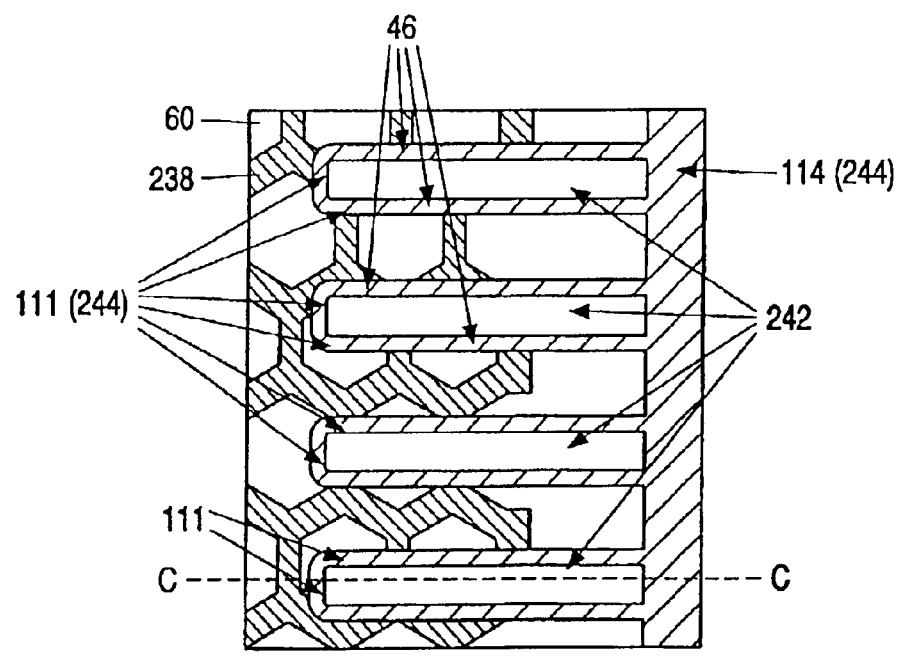
FIG. 17 is a schematic top view of the device part at the stage of FIG. 16, the FIG. 16 view being taken on line C—C in FIG. 17.

Subsequently, a relatively thick TEOS layer 240 is deposited and etched with a mask that defines oxide fingers 242, as shown in FIGS. 16 and 17. The width of the oxide fingers 242 is not critical. However, it is generally useful to create as many oxide fingers 242 as possible. This results in lower gate resistance.

Figure 15:
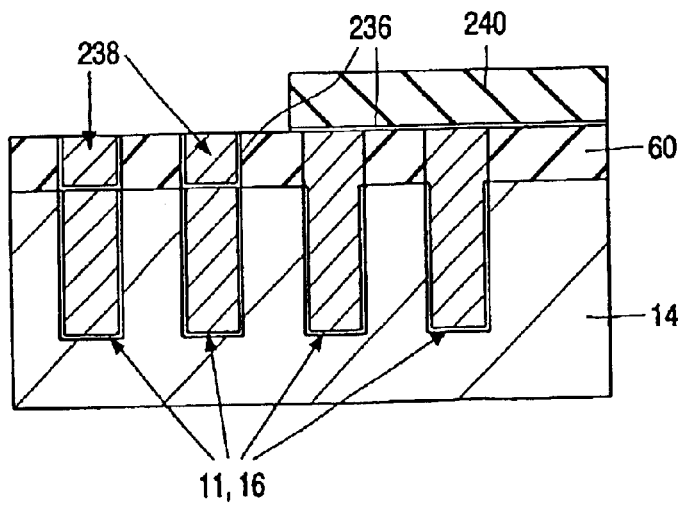

The TEOS etch, with which the oxide fingers 242 are formed, stops on the nitride layer 236 underneath. Subsequently, the areas of this nitride layer 236 not masked by the oxide 240 is etched away as shown in FIG. 15.

Then, a third layer 244 of polysilicon is contour-deposited and etched back anistropically, while masking areas where a gate pad and/or field plate 114 are required. Due to this etch-back, loop-shaped polysilicon fingers 111 are formed as polysilicon spacers at the side walls of the oxide fingers 242, as shown in FIGS. 16 and 17.

Figure 18:
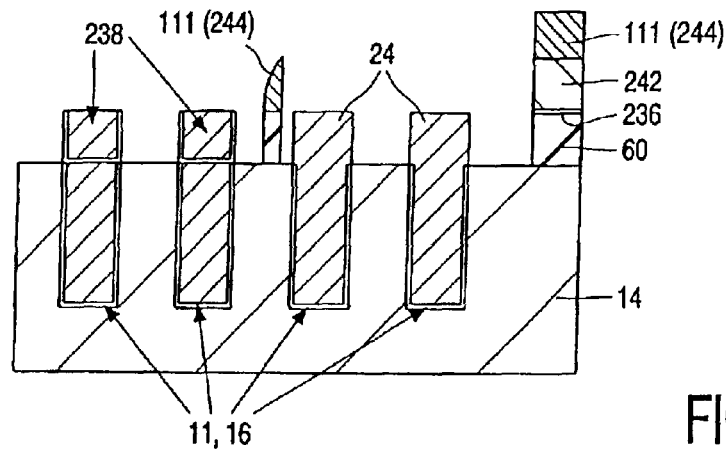
FIGS. 18 and 19 are respective sectional and top views corresponding to FIGS. 16 and 17 but at a subsequent stage in the manufacture in accordance with the second embodiment, the FIG. 18 view being taken on line C—C in FIG. 19.
Figure 19:
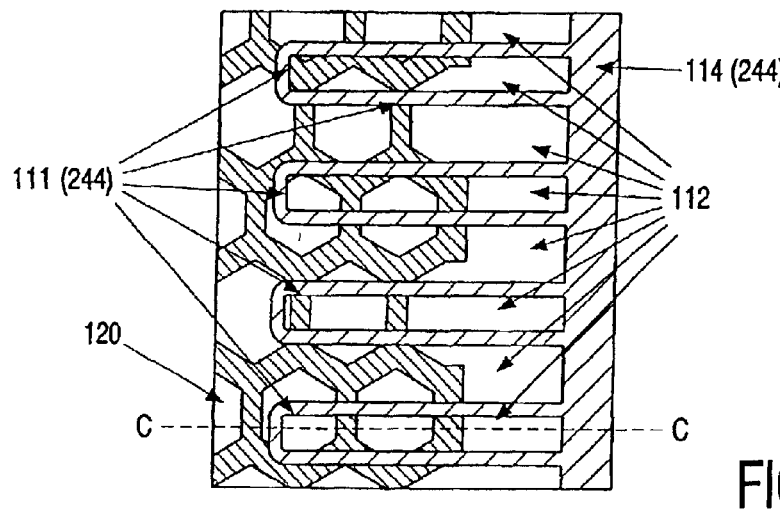

Then, except where masked by the polysilicon parts 111 and 114, the oxide 60, the oxide fingers 242 and the intermediate nitride layer 236 are etched back anisotropically to the wafer surface 14a. FIGS. 18 and 19 illustrate the resulting structure at this stage.

Then, as illustrated in FIG. 20, the P-body implant 151 is performed to provide the dopant for the channel-accommodating region in the active area 120 and that for its edge-region extension 15a in the gate-connection area 50. Thereafter, the implanted dopant is diffused so as to form the at least substantially continuously region 15a beneath the polysilicon fingers 111. This continuity of region 15a is easily achieved without requiring long diffusion times, due to the very narrow width of the polysilicon spacer fingers 111, as shown in FIG. 20.

Such a polysilicon spacer technology creates narrower fingers than those made by using a mask, so providing an advantage for the self-aligned option. However, such spacer technology can also be used advantageously for the gate connection in a conventional trench-gate MOSFET process. It gives the opportunity to perform both the P-body and AP implants later in the process, which is desirable for an optimised P-body doping profile. A suitable process flow for a conventional trench-gate MOSFET example would be as follows:

After the epitaxial layer growth for the drift region, the gate trenches are etched. The gate oxide is then grown, and the polysilicon is deposited and etched back down to the silicon surface. Subsequently, a relatively thin nitride layer is deposited, followed by a relatively thick TEOS layer. After this, the TEOS layer is etched back with a mask that defines oxide fingers. The TEOS stops on the nitride layer underneath, which protects the gate oxide during the TEOS etch. Subsequently, the nitride layer is etched away. Then, a polysilicon layer is deposited and etched back anistropically with a mask and the polysilicon spacers are formed at the side walls of the oxide fingers. After this, all oxide (including the oxide fingers) and the thin nitride layer underneath is etched back anistropically down to the silicon surface. Subsequently, the AP implant is performed and diffused, and the P-body implant is performed. Further process steps are the same as in the conventional process flow (i.e. source implantation and anneal, TEOS deposition, CO contact window etch, etc. as described above.

The above embodiments of FIGS. 2 to 20 disclose advantageous methods of using polysilicon fingers to connect a trench-gate network to a field plate or gate pad. The use of the fingers allows a P-body or AP implant to be implanted after formation of the fingers and subsequently diffused beneath the fingers to form a continuous P-type edge region. The narrowness of the fingers allows such diffusion.

From reading the present disclosure, other variations and modifications will be apparent to persons skilled in the art. Such variations and modifications may involve equivalent and other features which are already known in the manufacture of semiconductor devices and which may be used instead of or in addition to features already described herein.

In the above description, reference is made to p-type implants to form an n-channel device. Of course n-type implants could also be used to form p-channel devices. Thus, the particular examples described above are n-channel devices, in which the source and drain regions 13 & 14 are of n-type conductivity, the regions 32, 26 are p-type, and an electron inversion channel 12 is induced in the active region 32 by the trench-gate. By using opposite conductivity type dopants, a p-channel device can be manufactured by a method in accordance with the invention. In this case, the source and drain regions 13 & 14 are of p-type conductivity, the regions 32, 26 are n-type, and a hole inversion channel 12 is induced in the active region 32 by the trench-gate. The above references to P-body and AP implants can then be taken to be references to respective channel (N-body) and ruggedness/guard-ring (AN) implants.

The present invention may be applied to power MOSFETs of the planar DMOS type (instead of the trench-gate type), i.e. the MOS gate may be present on a dielectric layer on the body surface (instead of in a trench). It may be applied to solve similar problems in other semiconductor devices, for example bipolar transistors (instead of MOSFETs). The active device area of such devices may be cellular or not. Thus, the present invention may be used generally to provide a connection (in the form of the conductive fingers) from an active device area over an edge region, in which the edge region is formed in the device body by implanting dopant between the fingers and diffusing the implanted dopant under the fingers.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A method of manufacturing a semiconductor device comprising an electrically conductive connection that extends over an edge region of an active area of the device, wherein the connection comprises electrically-parallel conductive fingers, and wherein the method includes the steps of:
   (a) forming the fingers over an area where the edge region of the active area of the device is to be provided;
   (b) subsequently implanting dopant of a first conductivity type for the edge region via spaces between said fingers; and
   (c) diffusing the dopant beneath the fingers so as to form the edge region as an at least substantially continuous region of the first conductivity type that extends beneath the fingers and beneath the spaces between the fingers, wherein the active area of the device comprises active device cells of an insulated-gate field-effect type having a gate network in the active area, each active device cell comprising an insulated-gate adjacent to a channel-accommodating region of a first conductivity type between source and drain regions of a second conductivity type, and wherein the fingers are provided as a gate connection from the gate network in the active area, after which the edge region is provided in steps (b) and (c) for terminating the channel-accommodating region around a perimeter of the active area.

2. A method according to claim 1, wherein the device is of a trench-gate type having its gate in a trench that extends from a surface-adjacent source region through the channel-accommodating region and into an underlying portion of the drain region, the gate being dielectrically coupled to the channel-accommodating region by providing an insulating layer at sidewalls of the gate trench, and wherein the trench-gate network is formed before providing the edge region, after which the edge region is provided where the gate trench network ends at the perimeter of the active area.

3. A method according to claim 2, wherein the edge region provided in steps (b) and (c) is deeper and more highly doped than the channel-accommodating region.

4. A method according to claim 3, wherein the edge region is provided in steps (b) and (c) to a depth greater than the gate trench.

5. A method according to claim 2, wherein the channel-accommodating region is provided after the trench-gate and after the edge region.

6. A method according to claim 2, wherein the edge region is provided as an extension of the channel-accommodating region beyond the cellular active area and in the same process steps as the channel-accommodating region.

7. A method according to claim 1, wherein the step (c) diffusion is performed in one or more stages at temperatures in excess of 950° C.

8. A method according to claim 1, wherein the electrically conductive fingers are formed of polysilicon and/or a silicide and/or a refractory metal.

9. A method according to claim 1, in which the fingers have a width in the range of about 0.1 μm to 2 μm.

10. A method according to claim 1, wherein the fingers are formed in step (a) with spaces between adjacent fingers that are at least three times wider than the finger width.

11. A method according to claim 1, wherein step (a) includes:
   (a.i) depositing material for forming the fingers;
   (a.ii) providing a mask on the deposited material to define a pattern for the fingers; and
   (a.iii) etching the deposited material to leave the fingers defined by the mask.

12. A method according to claim 11, wherein the device is of a trench-gate field-effect type having its gate dielectrically coupled to a channel-accommodating region by an intermediate gate dielectric layer provided at sidewalls of the gate trench, and wherein the gate is provided in the gate trench by the material that is deposited in step (a.i) and that is etched back in step (a.iii), the mask step of step (a.ii) not being present over the gate trench in the active area of the device, after which any etch-damaged areas of the gate dielectric layer are re-grown in a step (a.iv).

13. A method according to claim 1, wherein the device is of a trench-gate field-effect type, and wherein a first layer of gate material is deposited in the gate trench and etched back to leave the trench-gate in the gate trench, after which a second layer of material is deposited and etched in step (a) to provide the fingers of the connection to the trench-gate.

14. A method according to claim 1, wherein before the step (b) a mask is provided over the active area of the device to mask against the dopant implanted for the edge region, and this mask is removed after performing the step (b).

15. A method according to claim 1, in which material is etched away from beneath the fingers of the said connection so as to leave the fingers free-standing over at least a part of their length.

16. A method according to claim 1, wherein the step (a) includes:
   (a.i) depositing a sacrificial layer and pattering said layer with a first mask to provide an outline for the desired pattern of the fingers;
   (a.ii) depositing material for the fingers over the patterned sacrificial layer;
   (a.iii) then etching back the finger material to form the fingers as sidewall spacers in the patterned sacrificial layer; and
   (a.iv) etching away the sacrificial layer to leave the fingers.

17. A method of manufacturing a semiconductor device comprising an electrically conductive connection that extends over an edge region of an active area of the device, wherein the connection comprises electrically-parallel conductive fingers, and wherein the method includes the steps of:
   (a) forming the fingers over an area where the edge region is to be provided;
   (b) subsequently implanting dopant of a first conductivity type for the edge region via spaces between the fingers; and
   (c) diffusing the dopant beneath the fingers so as to form the edge region as an at least substantially continuous region of the first conductivity type that extends beneath the fingers and beneath the spaces between the fingers, wherein the diffusion is performed in one or more stages at temperatures in excess of 950° C.

18. A method of manufacturing a semiconductor device comprising an electrically conductive connection that extends over an edge region of an active area of the device, wherein the connection comprises electrically-parallel conductive fingers, and wherein the method includes the steps of:
   (a) forming the fingers over an area where the edge region is to be provided, wherein the fingers are formed with spaces between adjacent fingers that are at least three times wider than a width of the fingers;
   (b) subsequently implanting dopant of a first conductivity type for the edge region via the spaces between the fingers; and
   (c) diffusing the dopant beneath the fingers so as to form the edge region as an at least substantially continuous region of the first conductivity type that extends beneath the fingers and beneath the spaces between the fingers.

19. A method of manufacturing a semiconductor device comprising an electrically conductive connection that extends over an edge region of an active area of the device, wherein the connection comprises electrically-parallel conductive fingers, and wherein the method includes the steps of:
   (a) forming the fingers over an area where the edge region by:
      depositing a sacrificial layer and pattering the sacrificial layer with a first mask to provide an outline for a desired pattern of the fingers;
      depositing material for the fingers over the patterned sacrificial layer;
      etching back the finger material to form the fingers as sidewall spacers in the patterned sacrificial layer; and
      etching away the sacrificial layer to leave the fingers;
   (b) subsequently implanting dopant of a first conductivity type for the edge region via spaces between the fingers; and
   (c) diffusing the dopant beneath the fingers so as to form the edge region as an at least substantially continuous region of the first conductivity type that extends beneath the fingers and beneath the spaces between the fingers.

* * * * *